(12) United States Patent
Chen et al.

(10) Patent No.: US 11,889,641 B2
(45) Date of Patent: Jan. 30, 2024

(54) DISPLAY DEVICE AND FIXING MODULE THEREOF

(71) Applicant: Qisda Corporation, Taoyuan (TW)

(72) Inventors: Jen-Feng Chen, Taichung (TW); Ying-Yu Tsai, Taoyuan (TW); Kuan-Hsu Lin, New Taipei (TW); Hsin-Hung Lin, Taoyuan (TW); Shih-An Lin, New Taipei (TW); Yung-Chun Su, Taoyuan (TW); Hsin-Che Hsieh, Taoyuan (TW); Hao-Chun Tung, Taoyuan (TW); Yang-Zong Fan, Taoyuan (TW); Chih-Ming Chang, Taoyuan (TW)

(73) Assignee: Qisda Corporation, Taoyuan (TW)

( * ) Notice: Subject to any disclaimer, the term of this patent is extended or adjusted under 35 U.S.C. 154(b) by 0 days.

(21) Appl. No.: 17/668,470

(22) Filed: Feb. 10, 2022

(65) Prior Publication Data
US 2023/0189456 A1 Jun. 15, 2023

(30) Foreign Application Priority Data
Dec. 13, 2021 (TW) .................................. 110146537

(51) Int. Cl.
*H05K 5/02* (2006.01)
(52) U.S. Cl.
CPC .................. *H05K 5/0204* (2013.01)
(58) Field of Classification Search
CPC .................................................. H05K 5/0204
See application file for complete search history.

(56) References Cited

U.S. PATENT DOCUMENTS

| | | | | |
|---|---|---|---|---|
| 6,239,841 B1* | 5/2001 | Verstockt | ............... | F16M 13/02 348/375 |
| 6,370,741 B1* | 4/2002 | Lu | ......................... | A47B 21/045 24/523 |
| 6,394,403 B1* | 5/2002 | Hung | ................... | F16M 13/022 248/278.1 |

(Continued)

FOREIGN PATENT DOCUMENTS

CN 105937688 B * 5/2018
CN 209245661 U * 8/2019

(Continued)

OTHER PUBLICATIONS

Translation of CN-105937688-B (Year: 2018).*

(Continued)

*Primary Examiner* — Abhishek M Rathod
*Assistant Examiner* — Keith DePew

(57) ABSTRACT

A display device includes a screen, a screen stand and a fixing module. The screen stand is pivotally connected to the screen. The fixing module is connected to the screen stand and configured to clamp a first surface and a second surface of a board and includes a connecting element, a first abutting element and a second abutting element. The first abutting element is fixed to the connecting element and configured to abut against the first surface of the board. The second abutting element is pivotally connected to the connecting element and includes an abutting end configured to abut against the second surface of the board.

11 Claims, 7 Drawing Sheets

(56) References Cited

U.S. PATENT DOCUMENTS

| | | | | |
|---|---|---|---|---|
| 6,418,010 B1* | 7/2002 | Sawyer | ............ | F16M 11/14 361/801 |
| 6,738,094 B1* | 5/2004 | Minami | ............ | H04N 7/142 348/E5.025 |
| 6,947,093 B2* | 9/2005 | Yanakawa | ............ | H04N 5/2251 348/E5.025 |
| 7,066,664 B1* | 6/2006 | Sitoh | ............ | F16M 11/126 396/428 |
| 7,121,516 B1* | 10/2006 | Koh | ............ | F16M 13/022 248/227.2 |
| 7,219,866 B2* | 5/2007 | Depay | ............ | F16M 13/022 248/231.41 |
| 7,503,709 B2* | 3/2009 | Liang | ............ | G03B 17/00 396/428 |
| 7,572,073 B2* | 8/2009 | Kenoyer | ............ | F16M 13/022 396/428 |
| 7,660,113 B2* | 2/2010 | Kaneko | ............ | F16M 13/005 361/679.59 |
| 7,931,243 B2* | 4/2011 | Yim | ............ | H04R 1/026 248/231.51 |
| 7,975,975 B2* | 7/2011 | Lee | ............ | F16M 11/046 248/176.1 |
| 8,267,360 B2* | 9/2012 | Su | ............ | F16M 11/24 248/162.1 |
| 8,313,069 B2* | 11/2012 | Yim | ............ | H04R 1/026 248/231.51 |
| 8,366,060 B2* | 2/2013 | Hung | ............ | F16M 13/022 248/278.1 |
| 8,531,826 B2* | 9/2013 | Su | ............ | F16M 11/10 361/679.01 |
| 8,794,579 B2* | 8/2014 | Sturman | ............ | F16M 11/041 248/921 |
| 9,169,962 B2* | 10/2015 | Wang | ............ | F16M 11/14 |
| 9,366,379 B2* | 6/2016 | Bowman | ............ | F16M 11/045 |
| 9,420,887 B2* | 8/2016 | Reviel | ............ | A47B 97/00 |
| 10,208,891 B2* | 2/2019 | Myerchin | ............ | F16M 11/38 |
| 11,039,049 B2* | 6/2021 | Michaelian | ...... | H04N 5/225251 |
| 11,098,845 B2* | 8/2021 | Huang | ............ | F16M 11/041 |
| 11,112,057 B2* | 9/2021 | Janechek | ............ | F16M 11/28 |
| 11,131,332 B2* | 9/2021 | Huang | ............ | F16B 2/065 |
| 11,131,423 B2* | 9/2021 | Anderson | ............ | F16M 11/24 |
| 11,391,449 B1* | 7/2022 | Takayama | ............ | F21V 17/02 |
| 11,480,288 B2* | 10/2022 | Huang | ............ | F16M 11/10 |
| 2008/0251674 A1* | 10/2008 | Su | ............ | F16M 11/16 248/346.04 |
| 2008/0302926 A1* | 12/2008 | Cheng | ............ | F16M 13/02 248/161 |
| 2011/0243548 A1* | 10/2011 | Khamsepoor | ...... | G03B 17/04 396/428 |
| 2013/0161466 A1* | 6/2013 | Lau | ............ | F16B 7/10 248/288.11 |

FOREIGN PATENT DOCUMENTS

| | | | |
|---|---|---|---|
| CN | 215636318 U | * | 1/2022 |
| CN | 215636393 U | * | 1/2022 |
| CN | 216078954 U | * | 3/2022 |
| CN | 111637344 B | * | 4/2022 |
| KR | 20080063683 A | * | 7/2008 |

OTHER PUBLICATIONS

Translation of CN-215636393-U (Year: 2022).*
Translation of CN-216078954-U (Year: 2022).*
Translation of CN-111637344-B (Year: 2022).*
Translation of KR-20080063683-A (Year: 2008).*
Translation of CN-209245661-U (Year: 2019).*
Translation of CN-215636318-U (Year: 2022).*

* cited by examiner

DISPLAY DEVICE AND FIXING MODULE THEREOF

This application claims the benefit of Taiwan application Serial No. 110146537, filed Dec. 13, 2021, the subject matter of which is incorporated herein by reference.

TECHNICAL FIELD

The disclosure relates in general to a display device and a fixing module thereof.

BACKGROUND

Conventional display includes a screen, a stand and a base. The screen stand connects the screen with the base. In order to adjust an angle of the screen, the screen and the screen stand are usually pivotally connected in a relatively rotatable manner. The base is limited to lying flat on a flat surface (for example, desktop). However, such a structure limits the application of the display. Therefore, how to propose a new display to improve the aforementioned problems is one of the directions of the industry in this technical field.

SUMMARY

According to an embodiment, a display device is provided. The display device includes a screen, a screen stand and a fixing module. The screen stand is pivotally connected to the screen. The fixing module is connected to the screen stand and configured to clamp a first surface and a second surface of a board and includes a connecting element, a first abutting element and a second abutting element. The first abutting element is fixed to the connecting element and configured to abut against the first surface of the board. The second abutting element is pivotally connected to the connecting element and includes an abutting end configured to abut against the second surface of the board.

According to an embodiment, a fixing module is provided. The fixing module includes a connecting element, a first abutting element and a second abutting element. The first abutting element fixed to the connecting element and configured to abut against the first surface of the board. The second abutting element pivotally connected to the connecting element, wherein the second abutting element includes an abutting end configured to abut against the second surface of the board.

The above and other aspects of the disclosure will become better understood with regard to the following detailed description of the preferred but non-limiting embodiment (s). The following description is made with reference to the accompanying drawings.

Figure 1A:
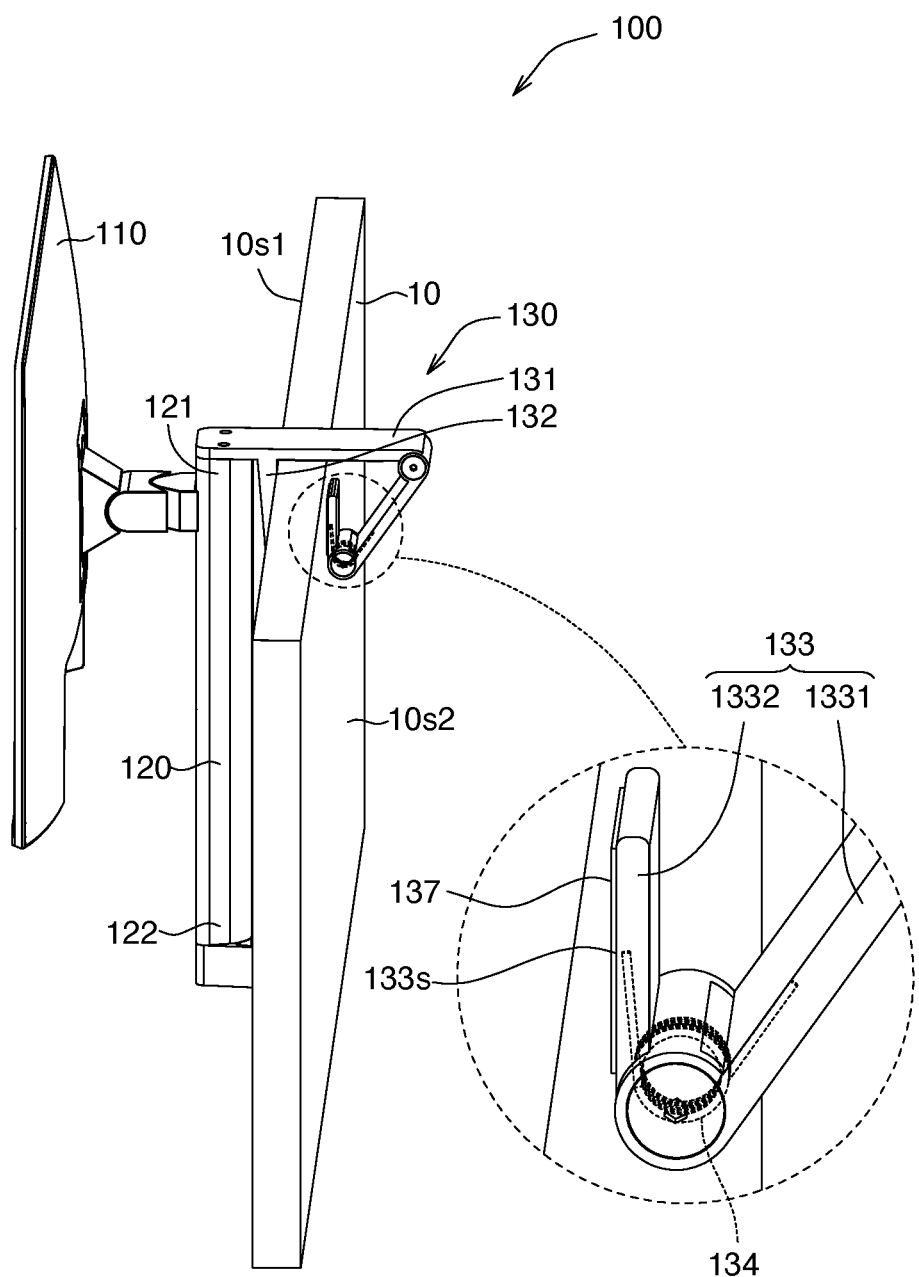
FIG. 1A shows a schematic diagram of a display device according to an embodiment of the present disclosure.

In the following detailed description, for purposes of explanation, numerous specific details are set forth in order to provide a thorough understanding of the disclosed embodiments. It will be apparent, however, that one or more embodiments may be practiced without these specific details. In other instances, well-known structures and devices are schematically shown in order to simplify the drawing.

DETAILED DESCRIPTION

Figure 1B:
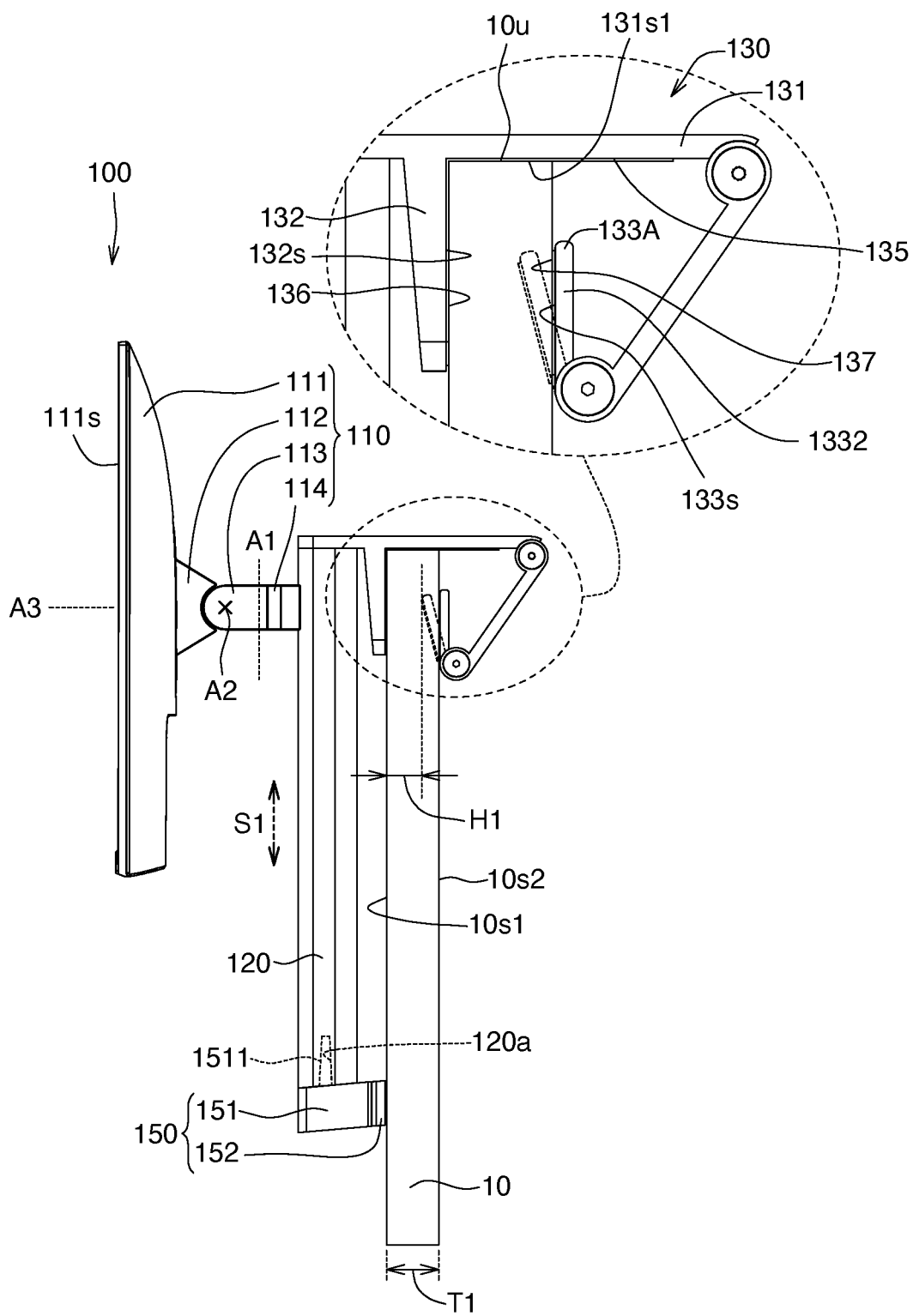
FIG. 1B shows a side view of the display device of FIG. 1A clamped on the board.
Figure 1C:
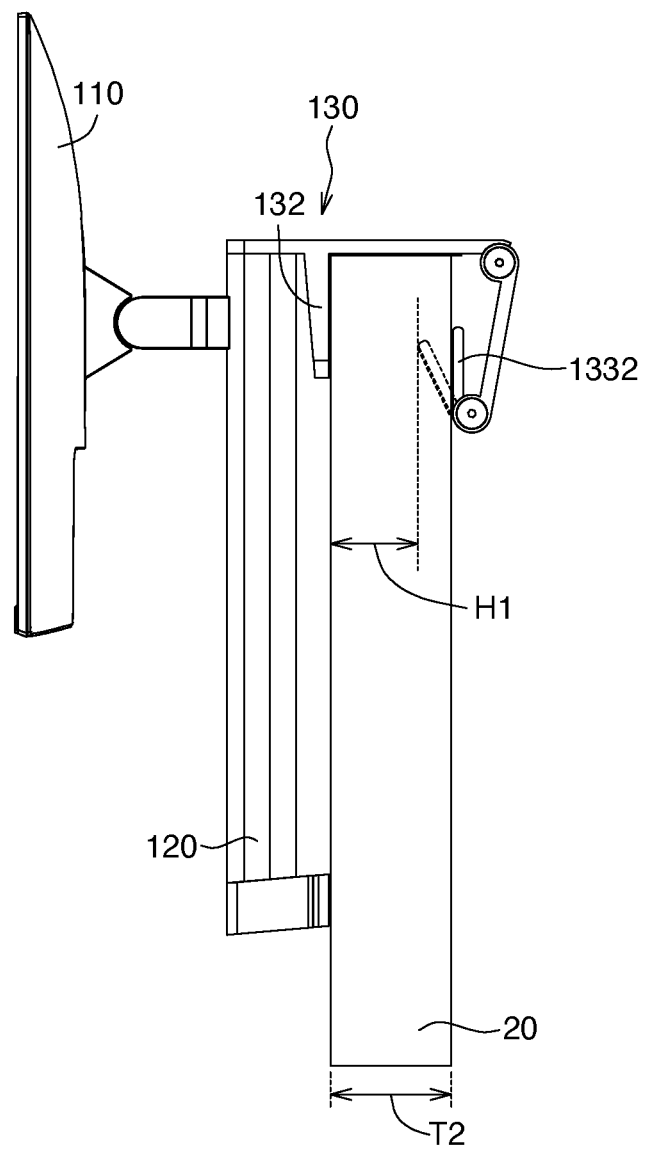
FIG. 1C shows a side view of the display device of FIG. 1B clamped on another board.
Figure 2:
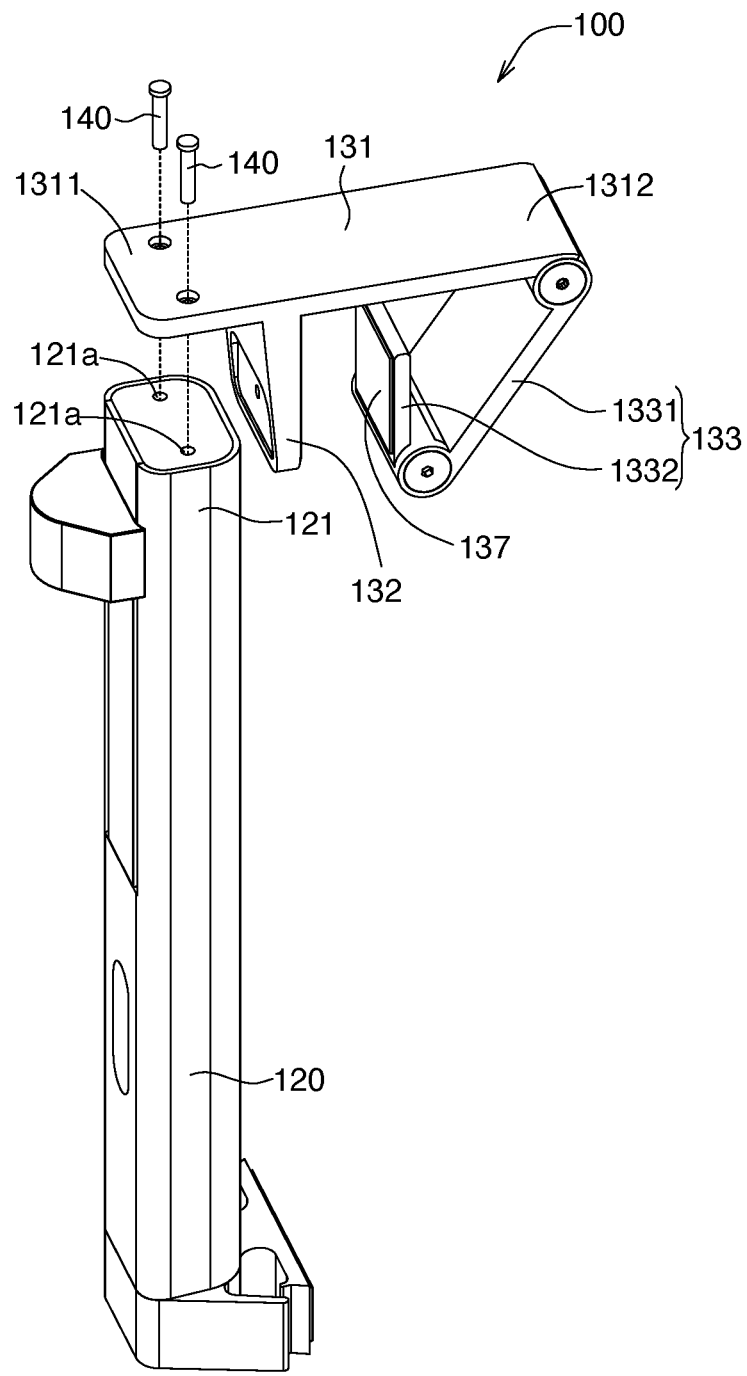
FIG. 2 shows an exploded view of the display device of FIG. 1B.

Referring to FIGS. 1A to 2, FIG. 1A shows a schematic diagram of a display device 100 according to an embodiment of the present disclosure, FIG. 1B shows a side view of the display device 100 of FIG. 1A clamped on the board 10, FIG. 1C shows a side view of the display device 100 of FIG. 1B clamped on another board 20, and FIG. 2 shows an exploded view of the display device 100 of FIG. 1B (the screen body 111 is not shown).

As shown in FIG. 1A, the display device 100 includes a screen 110, a screen stand 120, a fixing module 130, at least one fixing element 140 and an abutting element 150.

As shown in FIGS. 1A and 1B, the screen 110 includes a screen body (for example, a display panel) 111, a first pivoting element 112, a second pivoting element 113 and a third pivoting element 114. The screen body 111 could rotate relative to the screen stand 120 around at least one rotating shaft (or axial direction). The third pivoting element 114 and the second pivoting element 113 are rotatably connected (swivel) relative to a first rotation axis (or axial direction) A1, the first pivoting element 112 and the second pivoting element 113 are rotatably connected (tilt) relative to a second rotation axis A2, and the screen body 111 and the first pivoting element 112 are pivotably connected (pivot) rotatably relative to a third rotation axis A3, wherein two of the first rotation axis A1, the second rotation axis A2 and the third rotation axis A3 are, for example, perpendicular to each other, and the third rotation axis A3 is, for example, parallel to a normal direction of a display surface 111s of the screen body 111. In addition, the third pivoting element 114 and the screen stand 120 are relatively slidably disposed along an extension direction S1 of the screen stand 120. For example, the screen stand 120 has at least one sliding groove (not shown), and the third pivoting element 114 has at least one sliding block (not shown). The sliding block is pivotally connected to the sliding groove, so that the third pivoting element 114 and the screen stand 120 could relatively slide.

As described above, the screen body 111 could rotate around the first rotation axis A1, the second rotation axis A2 and/or the third rotation axis A3 and/or could slide along the extension direction S1 of the screen stand 120. As long as the screen body 111 could rotate around the first rotation axis A1, the second rotation axis A2 and/or the third rotation axis A3, the present invention does not limit the pivoting manner, structure and/or degree of freedom (DOF) of movement of the screen stand 120 and the screen 110.

The screen stand 120 is pivotally connected to the screen 110. The fixing module 130 is connected to the screen stand 120 and configured to clamp the opposite first surface 10s1 and second surface 10s2 of the board (or plate) 10 and includes a connecting element 131, a first abutting element 132 and a second abutting element 133. The first abutting element 132 is fixed to the connecting element 131 and configured to abut against the first surface of the board 10. The second abutting element 133 is pivotally connected to the connecting element 131, and an abutting end 133A of the second abutting element 133 is configured to abut against the second surface 10s2 of the board 10. As a result, the fixing module 130 could be clamped on opposite two sides of the board 10 to fix the relative position between the display device 100 and the board 10.

As shown in FIG. 1A, due to the second abutting element 133 being pivotally connected to the connecting element 131, a relative angle between the second abutting element 133 and the connecting element 131 could be adjusted to be suitable for clamping boards each having different thickness. For example, as shown in FIG. 1B, the fixing module 130 clamps the board 10, as shown in FIG. 1C, the fixing module 130 is clamped another board (or plate) wherein the thickness T1 of the board 10 is different from the thickness T2 of the board 20. For example, the thickness T2 of the board 20 is greater than the thickness T1 of the board 10. In the present embodiment, the board 10 and the board 20 are, for example, vertical partitions. In the present embodiment, the display surface 111s of the screen body 111 (after properly adjusting) could be substantially parallel to the extending direction of the boards 10 or 20.

As shown in FIG. 1A, the second abutting element 133 includes a first sub-abutting element 1331 and a second sub-abutting element 1332. The first sub-abutting element 1331 is pivotally connected to the connecting element 131. The second sub-abutting element 1332 is pivotally connected to the first sub-abutting element 1331 and has the abutting end 133A. In addition, the fixing module 130 further includes an elastic element 134. The elastic element 134 could be disposed in a pivot shaft that pivotally connects the second sub-abutting element 1332 with the first sub-abutting element 1331, and connects the second sub-abutting element 1332 and the first sub-abutting element 1331. As a result, when the second sub-abutting element 1332 and the first sub-abutting element 1331 move relatively, the elastic element 134 is deformed to provide the second sub-abutting element 1332 and the first sub-abutting element 1331 with an elastic restoration force. When the board is located between the first abutting element 132 and the second abutting element 133, the elastic restoration force forms a clamping force for the board.

When the elastic element 134 is in the free state, an interval H1 between the first abutting element 132 and the abutting end 133A of the second sub-abutting element 1332 (the second sub-abutting element 1332 in the free state are drawn with dashed lines in FIGS. 1B and 1C) smaller than the thickness T1 of the board 10 (as shown in FIG. 1B) or smaller than the thickness T2 of the board 20 (as shown in FIG. 1C). Thus, as shown in FIG. 1B, when the first abutting element 132 and the second sub-abutting element 1332 of the fixing module 130 respectively abut against opposite two sides of the board 10, the elastic element 134 could provide the second sub-abutting element 1332 with the elastic restoration force to form the clamping force exerted by the first abutting element 132 and the second sub-abutting element 1332 on the board 10. Similarly, as shown in FIG. 1C, when the first abutting element 132 and the second sub-abutting element 1332 of the fixing module 130 respectively abut against opposite two sides of the board 20, the elastic element 134 could provide the second sub-abutting element 1332 with the elastic restoration force to form the clamping force exerted by the first abutting element 132 and the second sub-abutting element 1332 on the board 20.

In another embodiment, the fixing module 130 could omit the second sub-abutting element 1332. In this situation, the elastic element 134 connects the connecting element 131 with the first sub-abutting element 1331 of the second abutting element 133, it could also achieve the similar or the same technical effects as described above, and the similarities are not be repeated here.

As shown in FIGS. 1A and 2, in the present embodiment, the fixing module 130 is connected to the first end 121 of the screen stand 120. The connecting element 131 includes a connecting end 1311 and a pivoting end 1312. The pivoting end 1312 is pivotally connected to the second abutting element 133, and the first abutting element 132 is connected to a portion between the connecting end 1311 and the pivoting end 1312 and substantially perpendicular to the connecting end 1311. In the present embodiment, the connecting element 131 is shaped into, for example, a flat plate.

As shown in FIG. 2, the fixing module 130 is connected to the first end 121 of the screen stand 120 by a connecting element 131. For example, the connecting end 1311 has at least one through hole 131a, and the first end 121 of the screen stand 120 has at least one fixing hole 121a. The fixing element 140 passes through the through hole 131a and is fixed to the fixing hole 121a to fix the relative position between the fixing module 130 and the screen stand 120. In an embodiment, the fixing hole 121a is, for example, a screw hole, and the fixing element 140 is, for example, a threaded element. In another embodiment, the fixing hole 121a is, for example, an engaging hole (without thread), and the fixing element 140 is, for example, a fastener.

As shown in FIG. 1B, the connecting element 131 further includes a first surface 131s1 extending between the connecting end 1311 and the pivoting end 1312. The first surface 131s1 faces a top surface 10u of the board 10. The first surface 131s1 has a geometry matched with that of the top surface 10u. For example, the first surface 131s1 and the top surface 10u are both flat surfaces. Alternatively, the first surface 131s1 and the top surface 10u respectively are a concave surface and a convex surface matched with the concave surface. Alternatively, the first surface 131s1 and the top surface 10u respectively are a convex surface and a concave surface matched with the convex surface.

As shown in FIG. 1B, the fixing module 130 further includes a first spacer 135. The first spacer 135 is disposed on the first surface 131s1 and configured to abut against the top surface 10u of the board 10. As a result, the top surface 10u of the board 10 and the first surface 131s1 of the connecting element 131 could be prevented from being easily worn resulted from directly contacting. In another embodiment, the fixing module 130 could omit the first spacer 135. In this situation, the first surface 131s1 could abut against the top surface 10u of the board 10.

As shown in FIG. 1B, the fixing module 130 further includes a second spacer 136. The first abutting element 132 has a second surface 132s facing the second abutting element 133. The second spacer 136 is disposed on the second surface 132s for abutting against the first surface 10s1 of the board 10. As a result, it could prevent the first surface 10s1 of the board 10 and the second surface 132s of the first abutting element 132 from being easily worn resulted from directly contacting. In another embodiment, the fixing module 130 could omit the second spacer 136. In this situation, the second surface 132s could abut against the first surface 10s1 of the board 10.

As shown in FIG. 1B, the first spacer 135 and the second spacer 136 are connected to each other, but could also be separately disposed from each other. In an embodiment, the first spacer 135 and the second spacer 136 could be integrated into one piece (one integral structure).

As shown in FIG. 1B, the fixing module 130 further includes a third spacer 137. The second sub-abutting element 1332 has a third surface 133s. Under the angle of the second sub-abutting element 1332 being appropriately adjusted, the third surface 133s could face the first abutting element 132. The third spacer 137 is disposed on the third surface 133s and configured to abut against the second surface 10s2 of the board 10. As a result, it could prevent the second surface 10s2 of the board 10 and the third surface 133s of the second sub-abutting element 1332 being easily worn resulted from directly contacting. In another embodiment, the fixing module 130 could omit the third spacer 137. In this situation, the third surface 133s could abut against the second surface 10s2 of the board 10.

In addition, the aforementioned spacer is made of a deformable material, for example, rubber or plastic. The hardness of the spacer could be less than the hardness of the board to avoid abrasion of the board.

As shown in FIG. 1B, the abutting element 150 could include a main body 151 and a fixing portion 152, wherein the fixing portion 152 is disposed on the main body 151, and the main body 151 could include at least one fixing post 1511. The fixing post 1511 and the fixing hole 120a of the screen stand 120 could be temporarily engaged to fix the relative position between the abutting element 150 and the screen stand 120. In addition, one of the fixing portion 152 and the magnetic element (not shown) disposed on the first surface 10s1 of the board 10 is, for example, a magnet, and the other is, for example, a magnet or a magnetic element that could generate an induced magnetic field with such magnet, so that the abutting element 150 with magnetic force is combined with the magnetic element disposed on the first surface 10s1 of the board 10 by magnetic attraction. By fixing the fixing portion 152 and the board 10, the relative position between the screen stand 120 and the board 10 could be more stable or stably fixed. In another embodiment, the fixing portion 152 could not have magnetism, but simply (or merely, or purely) abut against the first surface 10s1 of the board 10. Alternatively, the abutting element 150 could omit the fixing portion 152, and the main body 151 could simply (or merely, or purely) abut against the first surface 10s1 of the board 10.

Figure 3A:
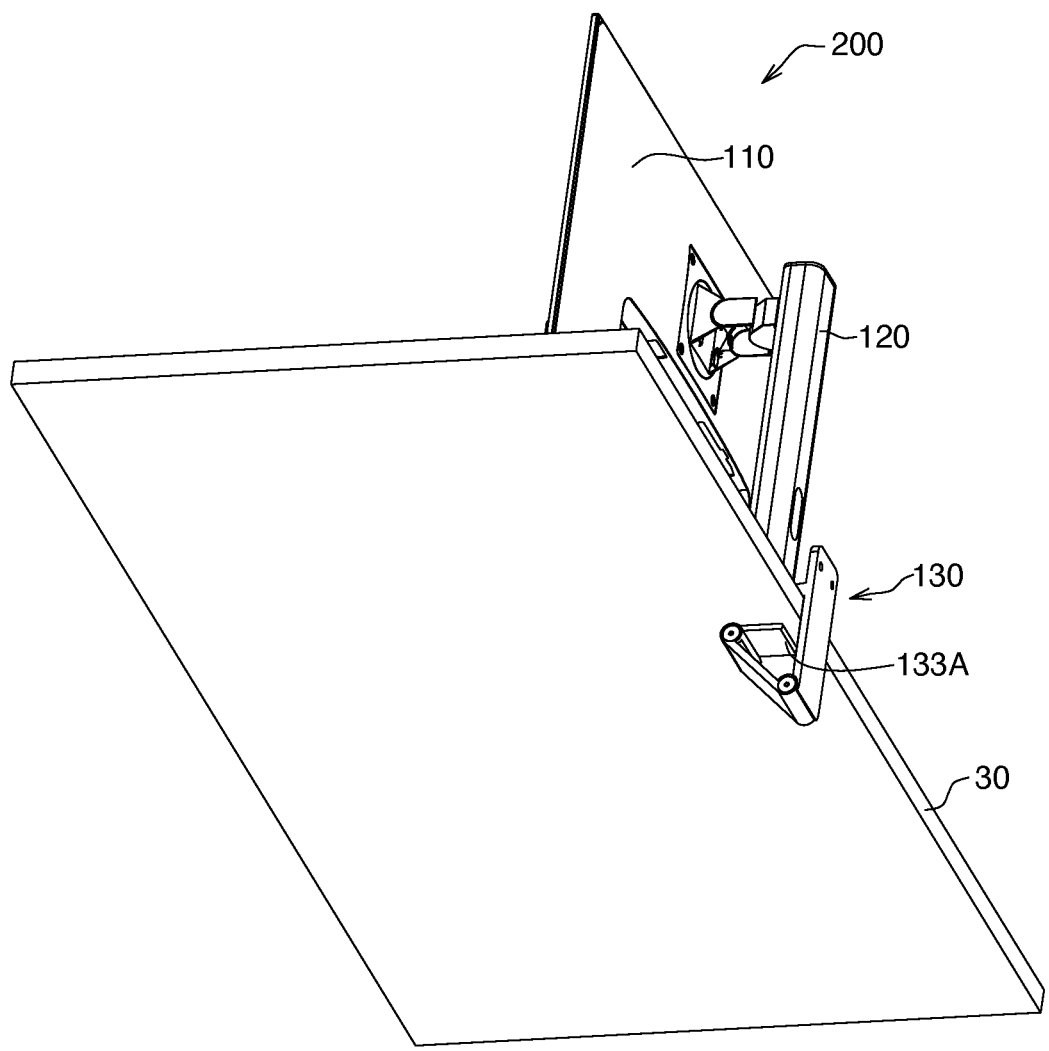
FIG. 3A shows a schematic diagram of a display device according to another embodiment of the present disclosure.
Figure 3B:
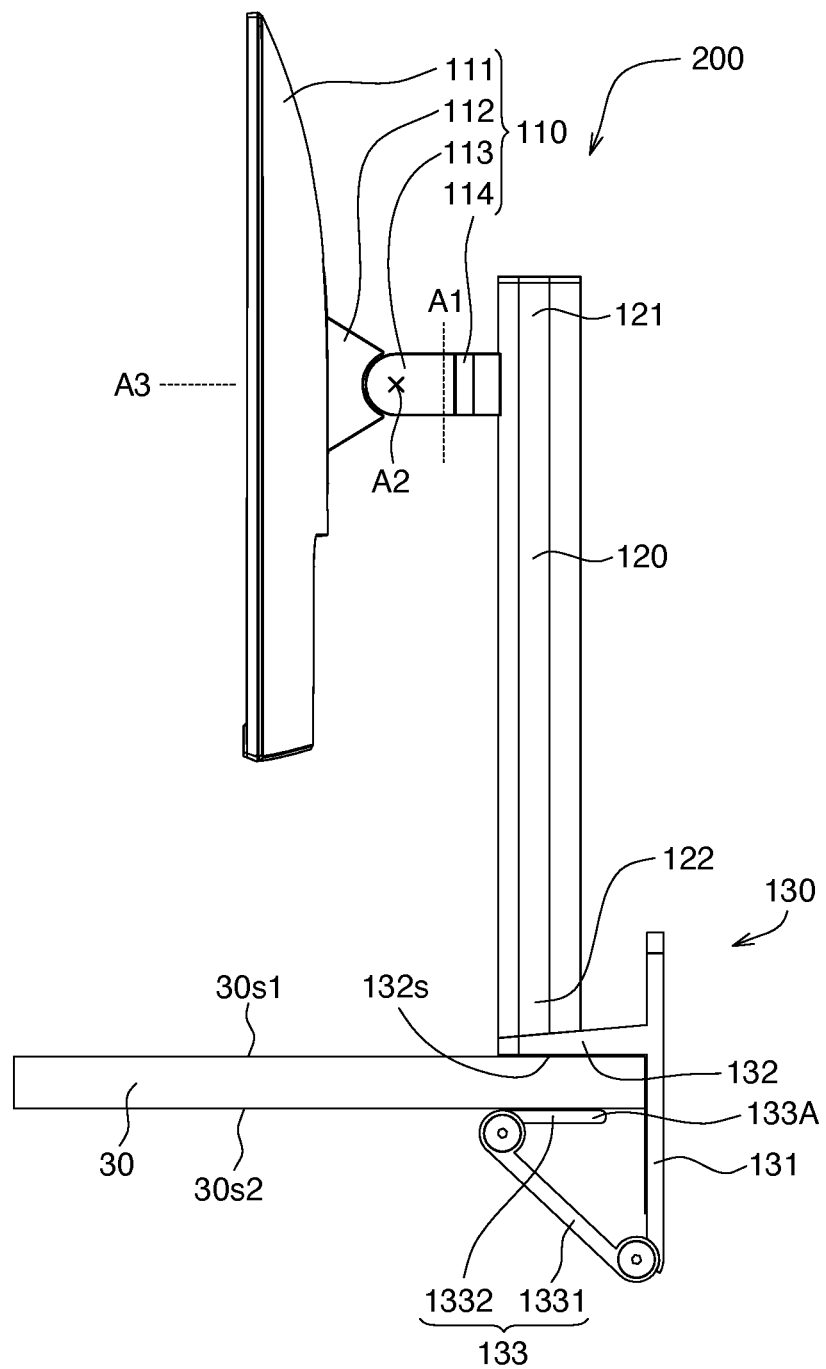
FIG. 3B shows a side view of the display device of FIG. 3A clamping the board.
Figure 4:
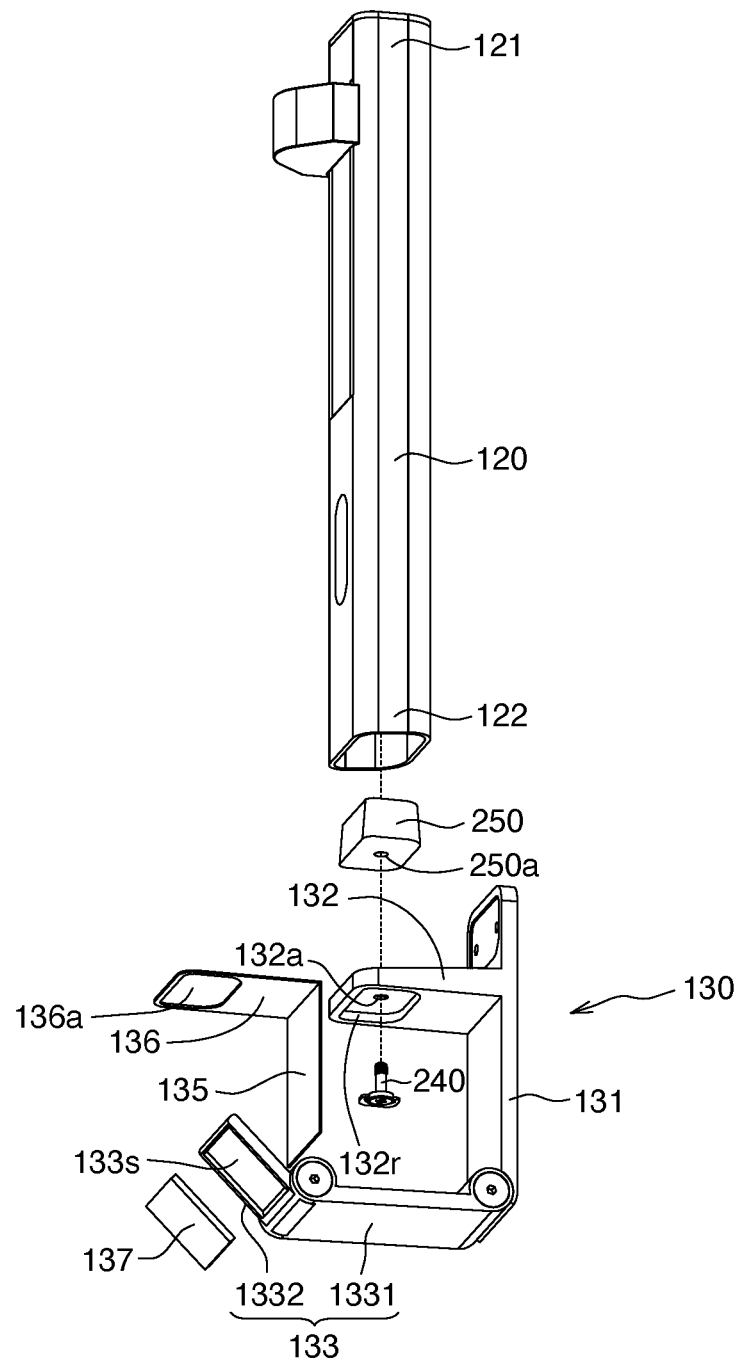
FIG. 4 shows an exploded view of the display device of FIG. 3B.

Referring to FIGS. 3A to 4, FIG. 3A shows a schematic diagram of a display device 200 according to another embodiment of the present disclosure, FIG. 3B shows a side view of the display device 200 of FIG. 3A clamping the board (or plate) 30, and FIG. 4 shows an exploded view of the display device 200 of FIG. 3B.

As shown in FIGS. 3A and 3B, the display device 200 includes the screen 110, the screen stand 120, the fixing module 130, at least one fixing element 240 and an adapter 250. The screen stand 120 is pivotally connected to the screen 110. The fixing module 130 is configured to clamp the opposite first surface 30s1 and the second surface 30s2 of the board 30 and includes the connecting element 131, the first abutting element 132 and the second abutting element 133. The connecting element 131 is connected to the screen stand 120. The first abutting element 132 is fixed to the connecting element 131 and configured to abut against the first surface 30s1 of the board 30. The second abutting element 133 is pivotally connected to the connecting element 131, and the abutting end 133A of the second abutting element 133 is configured to abut against the second surface 30s2 of the board 30. As a result, the fixing module 130 could clamp two opposite sides of the board 10 to fix the relative position of the display device 100 and the board 30. In addition, the board 30 could have the thickness T1 of the board 10 or the thickness T2 of the board 20 as described above.

The display device 200 has the same or similar technical features as the aforementioned display device 100, except that the fixing module 130 of the display device 200 is disposed at the second end 122 of the screen stand 120.

As shown in FIGS. 3B and 4, the fixing module 130 of the present embodiment is suitable for clamping the board 30 which horizontally extends, such as a table top. The display surface 111s of the screen body 111 (after proper adjusted) could be substantially perpendicular to the extending direction of the board 30. The fixing module 130 is connected to the second end 122 of the screen stand 120 by the first abutting element 132. After properly adjusting the angle of the first abutting element 132, the second surface 132s of the first abutting element 132 faces the first surface 30s1 of the board 30. The adapter 250 is disposed between the first abutting element 132 and the second end 122 of the screen stand 120. For example, the adapter 250 could be disposed within the second end 122, for example, the adapter 250 is fixed within the second end 122. The first abutting element 132 is connected to the adapter 250 to be connected to the second end 122 through the adapter 250.

As shown in FIG. 4, the first abutting element 132 has at least one through hole 132a, and the adapter 250 has at least one fixing hole 250a. The fixing element 240 passes through the through hole 132a and is fixed to the fixing hole 250a to fix the relative position between the fixing module 130 and the screen stand 120. In an embodiment, the fixing hole 250a is, for example, a threaded hole, and the fixing element 240 is, for example, a threaded element. In another embodiment, the fixing hole 250a is, for example, an engaging hole (without thread), and the fixing element 240 is, for example, a fastener. In addition, the first abutting element 132 has a groove 132r, and a top portion of the fixing element 240 could be entirely accommodated in the groove 132r to prevent from being protruding and accordingly it prevents from being interfering with the board 30 (shown in FIG. 3B). The second spacer 136 has a through hole 136a corresponding to the groove 132r in position to allow the fixing element 240 to pass through the through hole 136a and the groove 132r.

As described above, the display device 100 and the display device 200 could share some components, such as the screen 110, the screen stand 120 and the fixing module 130, wherein the fixing module 130 could be selectively connected to one of the first end 121 and the second end 122 of the screen stand 120, and accordingly it is suitable for clamping boards having different geometric types (for example, vertical board or horizontal board). In an embodiment, the fixing module could clamp two opposite sides of the board. For example, the fixing module could include two abutting elements which respectively abutting against two opposite sides of the board to fix or stabilize the relative position between the screen stand and the board. In addition, the angle between the two abutting elements of the fixing module could be adjusted for being suitable for clamping boards having different thicknesses.

It will be apparent to those skilled in the art that various modifications and variations could be made to the disclosed embodiments. It is intended that the specification and examples be considered as exemplary only, with a true scope of the disclosure being indicated by the following claims and their equivalents.

What is claimed is:

1. A display device, comprising:
   a screen;
   a screen stand connected to the screen and comprising a first end and a second end;
   a fixing module selectively connected to one of the first end and the second end of the screen stand, the fixing module comprising:
   a connecting element comprising a connecting end and a pivoting end;
   a first abutting element fixed to the connecting element, wherein the first abutting element is connected to a portion between the connecting end and the pivoting end and is substantially perpendicular to the connecting end; and
   a second abutting element pivotally connected to the pivoting end of the connecting element and comprising an abutting end;
   wherein when the fixing module is connected to the first end of the screen stand, the connecting end of the fixing module is fixed to the first end, the fixing module clamps a first board, the first abutting element configured to abut against a first side of the first board and the abutting end configured to abut against a second side of the first board,
   wherein when the fixing module is connected to the second end of the screen stand, the first abutting element of the fixing module is fixed to the second end of the screen stand, the fixing module clamps a second board, the first board is substantially perpendicular to the second board, the first abutting element is configured to abut against a first side of the second board, and the abutting end is configured to abut against a second side of the second board.

2. The display device according to claim 1, wherein the second abutting element further comprising:
   a first sub-abutting element pivotally connected to the connecting element and a second sub-abutting element pivotally connected to the first sub-abutting element and comprising the abutting end; and
   an elastic element connecting the second sub-abutting element with the first sub-abutting element, and when the elastic element is in a free state, an interval between the first abutting element and the abutting end of the second abutting element is smaller than a thickness of the first board;
   wherein when the connecting element and the first sub-abutting element are adjusted to maintain at an angle, the second sub-abutting element is adjustable for clamping the first board with different thickness.

3. The display device according to claim 1, wherein the fixing module is connected to the first end of the screen stand by the connecting element.

4. The display device according to claim 3, wherein the connecting element further comprises a first surface extending between the connecting end of the connecting element and the pivoting end of the connecting element, and the first surface faces a top side of the first board.

5. The display device according to claim 3, wherein the connecting element further comprises a first surface extending between the connecting end of the connecting element and the pivoting end of the connecting element; the fixing module further comprises:
   a first spacer disposed on the first surface for abutting against a top side of the first board.

6. The display device according to claim 1, wherein the fixing module is connected to the second end of the screen stand by the first abutting element.

7. The display device according to claim 6, wherein the first abutting element has a second surface facing the first side of the second board.

8. The display device according to claim 6, wherein the first abutting element has a second surface facing the second abutting element; the fixing module further comprises:
   a second spacer disposed on the second surface for abutting against the first side of the second board.

9. The display device according to claim 1, wherein the second sub-abutting element has a third surface which is allowed to face the first abutting element and is configured to abut against the second side of the first board.

10. The display device according to claim 1, wherein the second sub-abutting element has a third surface which is allowed to face the first abutting element; the fixing module further comprises:
    a third spacer disposed on the third surface and configured to abut against the second side of the first board.

11. The display device according to claim 1, where the fixing module further comprises:
    an adapter element disposed between the first abutting element and the second end of the screen stand.

* * * * *